United States Patent [19]
Chen et al.

[11] Patent Number: 5,644,266
[45] Date of Patent: Jul. 1, 1997

[54] DYNAMIC THRESHOLD VOLTAGE SCHEME FOR LOW VOLTAGE CMOS INVERTER

[76] Inventors: Ming-Jer Chen, No. 2, Lane 86, Chen-Kung 1st Rd., Chun-Kung Li, Hsinchu; Chuang-Hen Yang, No. 4, Alley 17, Lane 320, Sec. 2, Ching-Kuo Rd., Hsinchu, both of Taiwan

[21] Appl. No.: 559,201

[22] Filed: Nov. 13, 1995

[51] Int. Cl.$^6$ .................. H03K 19/003; H03K 19/0185
[52] U.S. Cl. ............... 327/534; 327/389; 327/391; 327/387; 326/27; 326/108
[58] Field of Search .......................... 327/534, 538, 327/543, 379–383, 387, 389, 391; 326/27, 81, 121, 108

[56] References Cited

U.S. PATENT DOCUMENTS

| | | | |
|---|---|---|---|
| 4,947,056 | 8/1990 | Jinbo | 327/538 |
| 5,212,415 | 5/1993 | Murakami et al. | 327/534 |
| 5,381,056 | 1/1995 | Murphy | 327/546 |
| 5,461,265 | 10/1995 | Kunihisa et al. | 327/379 |
| 5,543,734 | 8/1996 | Volk et al. | 327/543 |

*Primary Examiner*—Timothy P. Callahan
*Assistant Examiner*—T. Lam
*Attorney, Agent, or Firm*—Ladas & Parry

[57] ABSTRACT

The present invention utilizes a CMOS (complementary metal-oxide-semiconductor) inverter, which includes a PMOS transistor and an NMOS transistor connected in cascade, and back-gate biasing circuits. The back-gate biasing circuit consists of capacitors and loads (active load or passive load). By providing a bias voltage to either one of bulks of the transistors or both of them, the constituted CMOS inverter demonstrates higher operation speed and lower standby current than the conventional one.

10 Claims, 4 Drawing Sheets

DYNAMIC THRESHOLD VOLTAGE SCHEME FOR LOW VOLTAGE CMOS INVERTER

BACKGROUND OF THE INVENTION

1. Field of the Invention

The present invention generally relates to semiconductor integrated circuits. More particular, the present invention relates to a CMOS (Complementary metal-oxide-semiconductor) inverter with low-power consumption.

2. Description of the Related Art

As a result of fabrication techniques which allow the miniaturization of semiconductor ICs (Integrated Circuit), many portable electronic products, such as, cellular phones, pagers, lap-top computers, notebook computers, or even sub-notebook computers, can be commercially implemented. Nevertheless, these products are powered by batteries, for instance, nickel-cadmium, nickel-hydrogen o cells. To decrease the power consumption thereof, there is a need to lower the voltage supplied to semiconductor devices.

Referring to FIG. 1, a conventional CMOS inverter is schematically depicted, which is disclosed by Assaderaghi et al., "A Dynamic Threshold Voltage MOSFET (DTMOS) for Ultra-Low Voltage Operation," *IEEE International Electron Devices Meeting, Technical Digest*, pp. 809–812, 1994; Andoh et al., "Design Methodology for Low-Voltage MOSFETs," *IEEE International Electron Devices Meeting, Technical Digest*, pp. 79–84, 1994; as well as Assaderaghi et al., "A Dynamic Threshold Voltage MOSFET (DTMOS) for Very Low Voltage Operation," *IEEE Electron Device Letters*, Vol. 15, pp. 510–512, 1994. In the drawing, the conventional CMOS inverter comprises a PMOS transistor $M_3$ and an NMOS transistor $M_4$. Each transistor is a four-terminal device, having a drain, a source, a gate, and a bulk, respectively. The gates of the PMOS transistor $M_3$ and NMOS transistor $M_4$ are connected together to form an input terminal Vin. The drains of the PMOS transistor $M_3$ and NMOS transistor $M_4$ are connected together to form an output terminal Vout. The source of the PMOS transistor $M_3$ is connected to a voltage source $V_{DD}$; the source of the NMOS transistor $M_4$ is connected to the ground. Note that both bulks of the PMOS transistor $M_3$ and NMOS transistor $M_4$ are connected to the input terminal Vin.

In FIG. 2 depicts the circuit diagram of a first inverter 11 and a second inverter 12 connected in series. The first inverter 11 has an input terminal Vin1 and an output terminal Vout1. Also, the second inverter 12 has an input terminal Vin2 and an output terminal Vout2. Those inverters 11 and 12 are connected in series, that is, the output terminal Vout1 of the first inverter 11 is connected to the input terminal Vin2 of the second inverter 12. According to the conventional CMOS inverter depicted in FIG. 1, the first inverter 11 constitutes a PMOS transistor $M_{31}$ and an NMOS transistor $M_{41}$, while the second inverter 12 consists of a PMOS transistor $M_{32}$ and an NMOS transistor $M_{42}$.

As shown in FIG. 2, while a logic "high" level ($V_{DD}$) appears at the input terminal Vin1 of the first inverter 11, the output terminal Vout1 of the first inverter 11 reveals a logic "low" level ($\approx 0$ V). Therefore, a body current $I_1$, flowing through the forward-biased source-to-substrate junction of the PMOS transistor $M_{32}$ in the second inverter 12, predominantly contributes a non-zero input current flowing from the source to the drain of the NMOS transistor $M_{41}$ in the first inverter 11. This input current ranges from about $10^{-11}$ A to $10^{-7}$ A for the voltage source $V_{DD}$ from 0.3 V to 0.7 V. Although the inverter is operated at a steady state (Vin1=$V_{DD}$), this non-zero input current $I_1$ might result in a great amount of power consumption if a voltage source $V_{DD}$ of about 0.7 V is applied. On the other hand, another body current, flowing through the forward-biased bulk-to-source junction of the NMOS transistor $M_{41}$, also contributing the non-zero input current discharges the logic level stored at the input terminal Vin1, leading to a significant increase of refresh frequency. Conversely, if a voltage source less than about 0.3 V is applied, the non-zero input current seems so small as to be negligible. However, the input impedance of the inverters 11 and 12 becomes virtually capacitive and therefore constrains the operation speed thereof.

SUMMARY OF THE INVENTION

Therefore, it is an object of the present invention to provide a low-voltage CMOS inverter for accelerating operating speed by a capacitively-coupled back-gate forward biasing scheme.

It is another object of the present invention to provide a low-voltage CMOS inverter for decreasing the standby current thereof by a dynamic threshold voltage back-gate forward biasing scheme.

Accordingly, the present invention achieves the above-mentioned objects by providing a low-voltage inverter, comprising: a CMOS inverter consisting of a PMOS transistor and an NMOS transistor; and a back-gate biasing circuit consisting of a capacitor and a load, wherein the capacitor is connected between an input terminal of the CMOS inverter and one of bulks of the transistors for biasing via the load.

Furthermore, the present invention achieves the above-mentioned objects by providing a low-voltage inverter, comprising: a CMOS inverter consisting of a PMOS transistor and an NMOS transistor; and a back-gate biasing circuit consisting of a first capacitor, a second capacitor, a first load and a second load; wherein the first capacitor is connected between an input terminal of the CMOS inverter and a bulk of the PMOS transistor, the second capacitor is connected between the input terminal and a bulk of the NMOS transistor, the first load biases the bulk of the PMOS transistor, and the second load biases the bulk of the NMOS transistor.

DESCRIPTION OF THE PREFERRED EMBODIMENT

Figure 1:
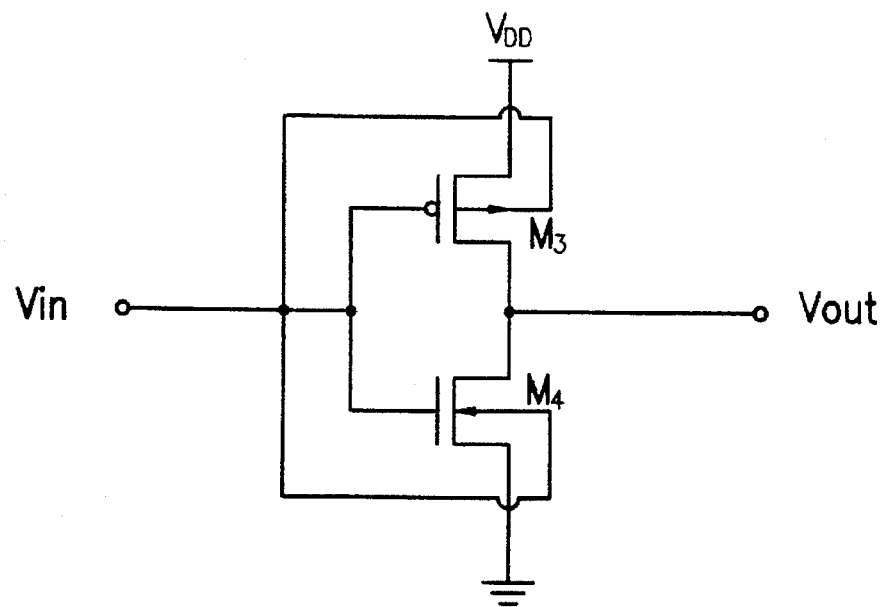
FIG. 1 (prior art) schematically depict a conventional CMOS inverter.
Figure 2:
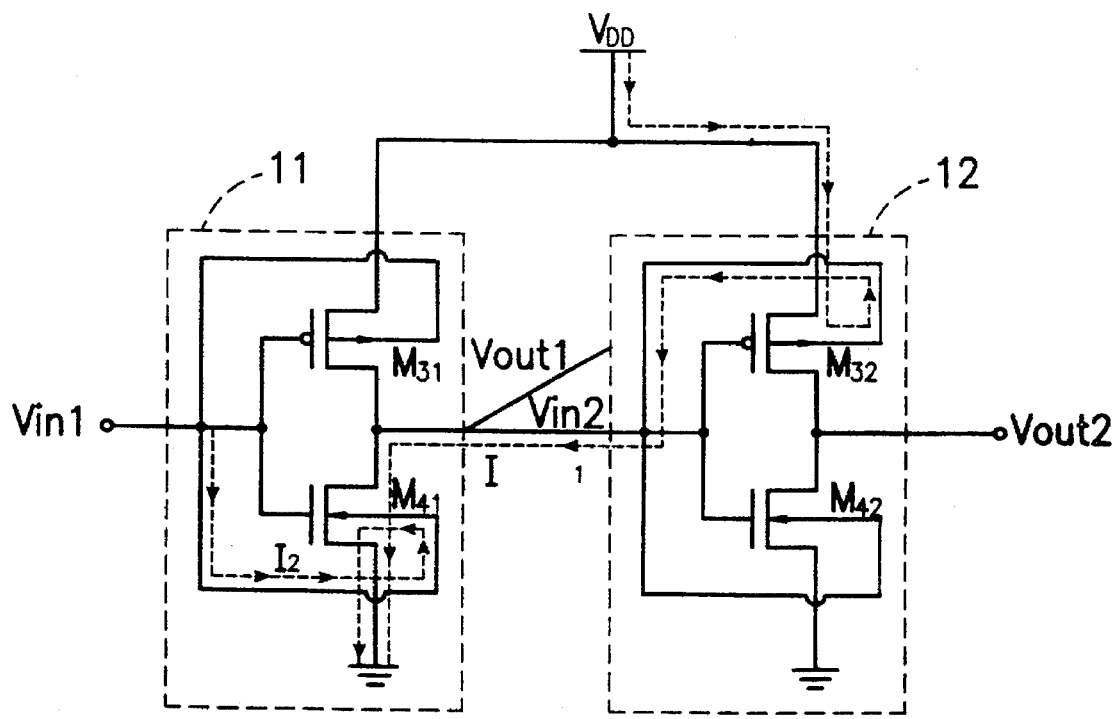
FIG. 2 (prior art) depicts two inverters, constituted by the CMOS inverter in accordance to FIG. 1, connected in series.
Figure 3:
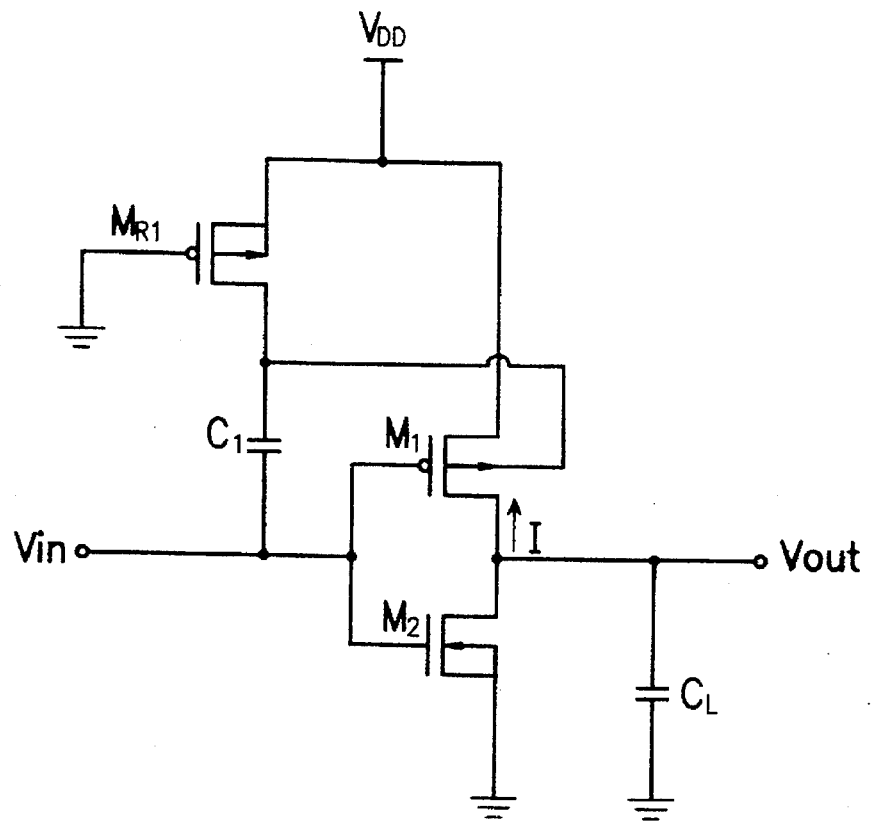
FIG. 3 schematically depicts one preferred embodiment of a CMOS inverter in accordance with the present invention.

As shown in FIG. 3, one preferred embodiment of a CMOS inverter in accordance with the present invention is schematically depicted. The CMOS inverter comprises a PMOS transistor $M_1$, an NMOS transistor $M_2$, a capacitor $C_1$, a load $M_{R1}$. Each transistor, $M_1$ or $M_2$, is a four-terminal device having a drain, a source, a gate, and a bulk, respectively. Those two transistors $M_1$ and $M_2$ are connected in cascade, that is, the gates of the PMOS transistor $M_1$ and the NMOS transistor $M_2$ are connected together to form an input terminal Vin, and the drains of the PMOS transistor $M_1$ and the NMOS transistor $M_2$ are connected together to form an output terminal Vout. The source of the PMOS transistor $M_1$ is connected to a voltage source $V_{DD}$ and the source of the NMOS transistor $M_2$ is connected to ground. The capacitor $C_1$ is coupled between the input terminal Vin and the bulk of the PMOS transistor $M_1$. The load $M_{R1}$ might be a passive load (e.g., a resistor) or an active load (e.g., a MOSFET device). As exemplified in FIG. 3, the load $M_{R1}$ is made of a PMOS transistor. The PMOS transistor $M_{R1}$ has a source, a drain, a gate, and a bulk. The source and bulk of the PMOS transistor $M_{R1}$ are connected to the voltage source $V_{DD}$, the gate is connected to ground, and the drain of the PMOS transistor $M_{R1}$ is connected to the bulk of the PMOS transistor $M_1$. Furthermore, an output load is designated as $C_L$ coupled between the output terminal Vout and the ground.

As the input voltage Vin transfers from "high" to "low" level, the bulk voltage of the PMOS transistor $M_1$ is pulled down by coupling via the capacitor $C_1$, thus forward biasing the bulk-to-source junction of the PMOS transistor $M_1$. This action leads to a reduction in the threshold voltage magnitude of the PMOS transistor $M_1$ constituting a significantly large current pulse to rapidly charge the output load $C_L$. Conversely, when the input voltage Vin transfers from "low" to "high" level, the bulk voltage of the PMOS transistor $M_1$ is pulled up by coupling via the capacitor $C_1$, thus reverse biasing the bulk-to-source junction of the PMOS transistor $M_1$. This action leads to an increase in the threshold voltage magnitude of the PMOS transistor $M_1$, and thus restrains the leakage current thereof. Namely, as the input voltage Vin transfers from "high" to "low", charging is determined by time constant $R_{Aff}C_1$, if the effective on-resistance of the PMOS transistor $M_{R1}$ is $R_{eff}$, the inverter then enters into a steady state at the output terminal Vout. Clearly, the CMOS inverter ensures a zero input current in the steady-state.

Figure 4:
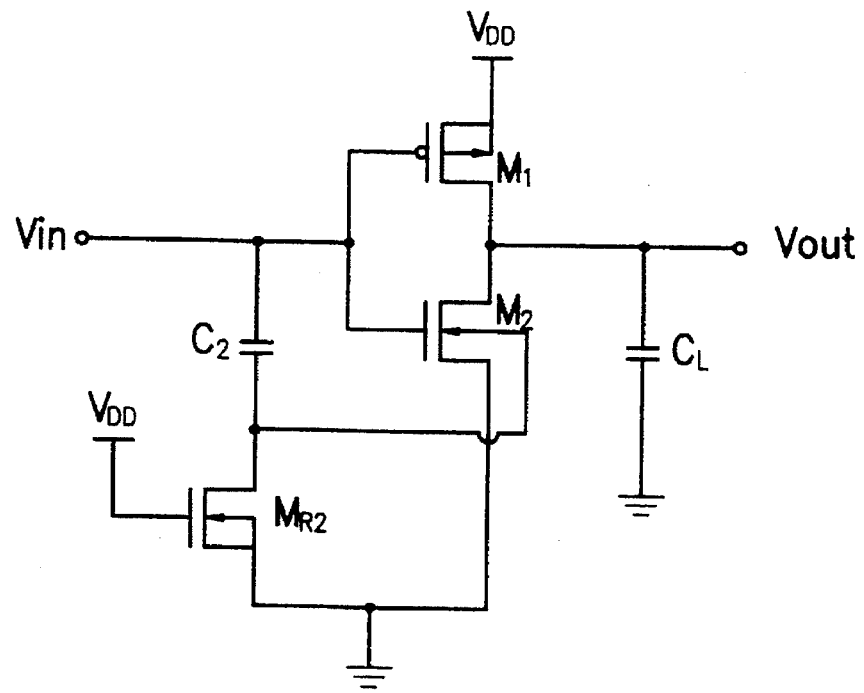
FIG. 4 schematically depicts another preferred embodiment of a CMOS inverter in accordance with the present invention.

As shown in FIG. 4, another preferred embodiment of a CMOS inverter in accordance with the present invention is schematically depicted. The CMOS inverter comprises a PMOS transistor $M_1$, an NMOS transistor $M_2$, a capacitor $C_2$, and a load $M_{R2}$. Each transistor, $M_1$ or $M_2$, is a four-terminal device having a drain, a source, a gate, and a bulk, respectively. Those two transistors $M_1$ and $M_2$ are connected in cascade, that is, the gates of the PMOS transistor $M_1$ and the NMOS transistor $M_2$ are connected together to form an input terminal Vin, and the drains of the PMOS transistor $M_1$ and the NMOS transistor $M_2$ are connected together to form an output terminal Vout. The source of the PMOS transistor $M_1$ is connected to a voltage source $V_{DD}$ and the source of the NMOS transistor $M_2$ is connected to the ground. The capacitor $C_2$ is coupled between the input terminal Vin and the bulk of the NMOS transistor $M_2$. The load $M_{R2}$ might be a passive load e.g., a resistor) or an active load (e.g., a MOSFET device). As exemplified in FIG. 4, the load $M_{R2}$ consists of an NMOS transistor. The NMOS transistor $M_{R2}$ has a source, a drain, a gate, and a bulk. The source and bulk of the NMOS transistor $M_{R2}$ are connected to the ground, the gate is connected to the voltage source $V_{DD}$, and the drain is connected to the bulk of the NMOS transistor $M_2$. Furthermore, an output load is designated as $C_L$ coupled between the output terminal Vout and the ground.

As the input voltage Vin transfers from "low" to "high" level, the bulk voltage of the NMOS transistor $M_2$ is pulled up by coupling via the capacitor $C_2$, thus forward biasing the bulk-to-source junction of the NMOS transistor $M_2$. This action leads to a reduction of the threshold voltage of the NMOS transistor $M_2$ constituting a significantly large current pulse to rapidly discharge the output load $C_L$. Conversely, when the input voltage Vin transfers from "high" to "low" level, the bulk voltage of the NMOS transistor $M_2$ is pulled down by coupling via the capacitor $C_2$, thus reversely biasing the bulk-to-source junction of the NMOS transistor $M_2$. This action leads to an increase in the threshold voltage of the NMOS transistor $M_2$ and thus restrain the leakage current thereof. Namely, as the input voltage Vin transfers from "low" to "high", discharging is determined by time constant $R_{eff}C_2$, if the effective on-resistance of the NMOS transistor $M_{R2}$ is $R_{eff}$, the inverter then enters into a steady state at the output terminal Vout. Clearly, the CMOS inverter ensures a zero input current in the steady-state.

Figure 5:
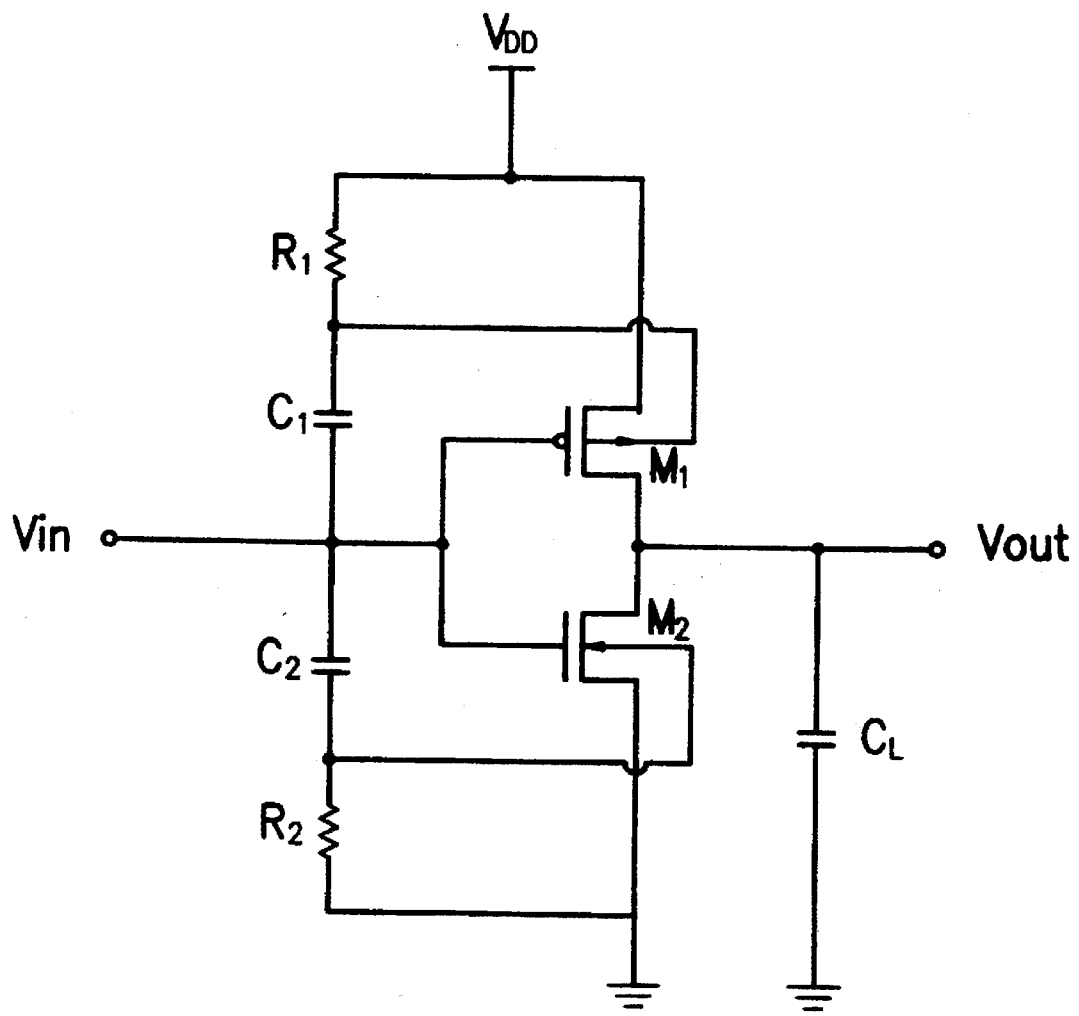
FIG. 5 schematically depicts yet another preferred embodiment of a CMOS inverter in accordance with the present invention.

Referring to FIG. 5, yet another preferred embodiment of a CMOS inverter in accordance with the present invention is depicted. The CMOS inverter comprises a PMOS transistor $M_1$, an NMOS transistor $M_2$, capacitors $C_1$ and $C_2$, and loads $R_1$, $R_2$. Each transistor, $M_1$ or $M_2$, is a four-terminal device having a drain, a source, a gate, and a bulk. Those two transistors $M_1$ and $M_2$ are connected in cascade, that is, the gates of the PMOS transistor $M_1$ and the NMOS transistor $M_2$ are connected together to form an input terminal Vin, and the drains of the PMOS transistor $M_1$ and the NMOS transistor $M_2$ are connected together to form an output terminal Vout. The source of the PMOS transistor $M_1$ is connected to a voltage source $V_{DD}$ and the source of the NMOS transistor $M_2$ is connected to ground. The capacitor $C_1$ is coupled between the input terminal Vin and the bulk of the PMOS transistor $M_1$. The capacitor $C_2$ is coupled between the input terminal Vin and the bulk of the NMOS transistor $M_2$. The load $R_1$ or $R_2$ might be made of either a passive load (e.g., a resistor) or an active load e.g., a MOSFET device). As exemplified in FIG. 5, both loads $R_1$ and $R_2$ consist of resistors. The load $R_1$ is coupled between the voltage source $V_{DD}$ and the bulk of the PMOS transistor $M_1$. The load $R_2$ is coupled between the bulk of the NMOS transistor $M_2$ and the ground. Furthermore, an output load designated as $C_L$ is coupled between the output terminal Vout and the ground.

In accordance with the present invention, the capacitor $C_1$ is inserted between the gate and the bulk of the transistors $M_1$, and the capacitor $C_2$ is coupled between the gate and the bulk of the transistors $M_2$. In addition, the load $R_1$ is connected between the bulk of the transistor $M_1$ and the voltage source $V_{DD}$, as well as the load $R_2$ is connected between the bulk of the transistor $M_2$ and the ground. In such a way, providing DC back-gate biasing to the bulks of the PMOS and NMOS transistors, respectively, is used to overcome the aforementioned problems arising from the non-zero input current.

As the input voltage Vin transfers from "high" to "low" level, the bulk voltage of the PMOS transistor $M_1$ is pulled down by coupling via the capacitor $C_1$, thus forward biasing the bulk-to-source junction of the PMOS transistor $M_1$. This action leads to a reduction in the threshold voltage magnitude of the PMOS transistor $M_1$ constituting a significantly large current pulse to rapidly charge the output load $C_L$. Conversely, when the input voltage Vin changes from "low"

to "high" level, the bulk voltage of the NMOS transistor $M_2$ is pulled up by coupling via the capacitor $C_2$, thus forward biasing the bulk-to-source junction of the NMOS transistor $M_2$. This action leads to a reduction in the threshold voltage of the NMOS transistor $M_2$, constituting a significantly large current pulse to rapidly discharge the output load $C_L$. As the input voltage Vin transients from "high" to "low" or vice versa, charging or discharging operation is determined by time constant $R_1C_1$ or $R_2C_2$, and then enters into a steady state at the output terminal Vout, respectively. Clearly, the CMOS inverter ensures a zero input current in the steady-state.

To provide more clear understanding of the present invention, the mixed-mode circuit and devices simulation by utilizing the program MEDICI (a two-dimensional device simulation program, Technology Modeling Association, Inc., 1993) performed on the circuit in FIG. 3. The gate width to length ratios are 40 µm/0.9 µm, 40 µm/0.9 µm, and 5 µm/0.8 µm for the transistors $M_1$, $M_2$, $M_{R1}$, respectively. The coupling capacitor $C_1$ is 0.3 pF. Owing to the back-gate forward bias, the threshold voltage might be electrically reduced while a small increase in back-gate forward bias can produce an exponential increase in the subthreshold current at zero gate-to-source voltage. The simulated waveforms of the output voltage Vout and the current I flowing through the drain of the PMOS transistor $M_1$ are depicted in FIG. 6 for $C_L$=1.0 pF at $V_{DD}$=0.7 V. In addition, a conventional CMOS inverter only constituted by the PMOS transistor $M_1$ and the NMOS transistor $M_2$ both with the source and bulk directly tied together is depicted for comparison. In the drawing, curves A and C represent the simulated waveforms of the CMOS inverter according to the present invention, and curves B and D designate the simulated waveforms based on the conventional one. During the time of the input terminal Vin reveals a pull-down transient, the bulk voltage of the PMOS transistor $M_1$ is lowered below $V_{DD}$ via the coupling of the capacitor $C_1$, thus instantly reducing the threshold voltage magnitude thereof. At that time, the drain current I is quickly increased and charges the output load $C_L$ like a pulse type, compared with the conventional one.

Figure 6A:
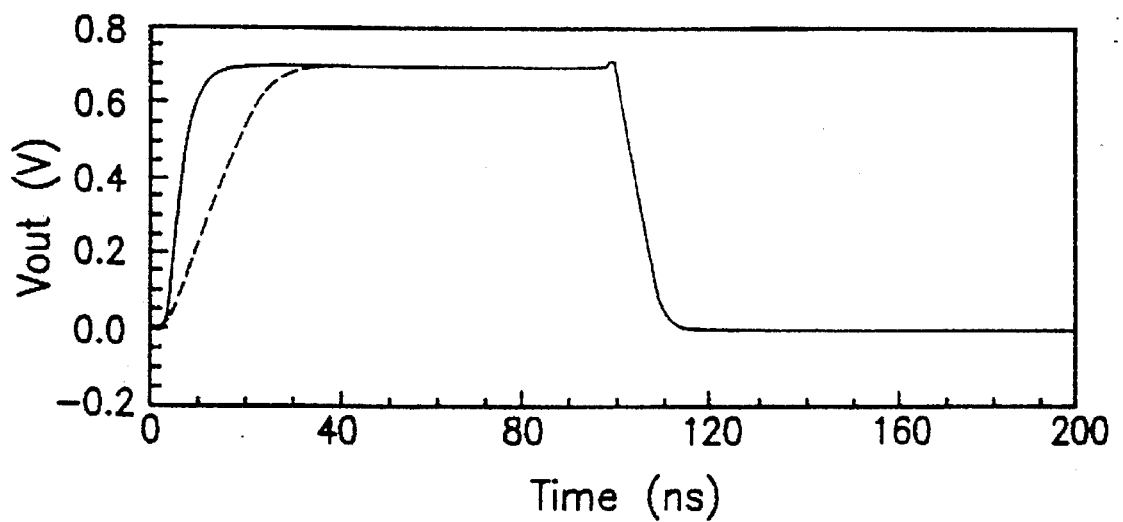
FIG. 6a and 6b depicts the simulated waveform diagrams of the output voltage Vout and current I flowing through the drain of the PMOS transistor $M_1$ in the circuit of FIG. 3. A conventional CMOS inverter including only $M_1$ and $M_2$ with the bulk and source tied together is also depicted for comparison.
Figure 6B:
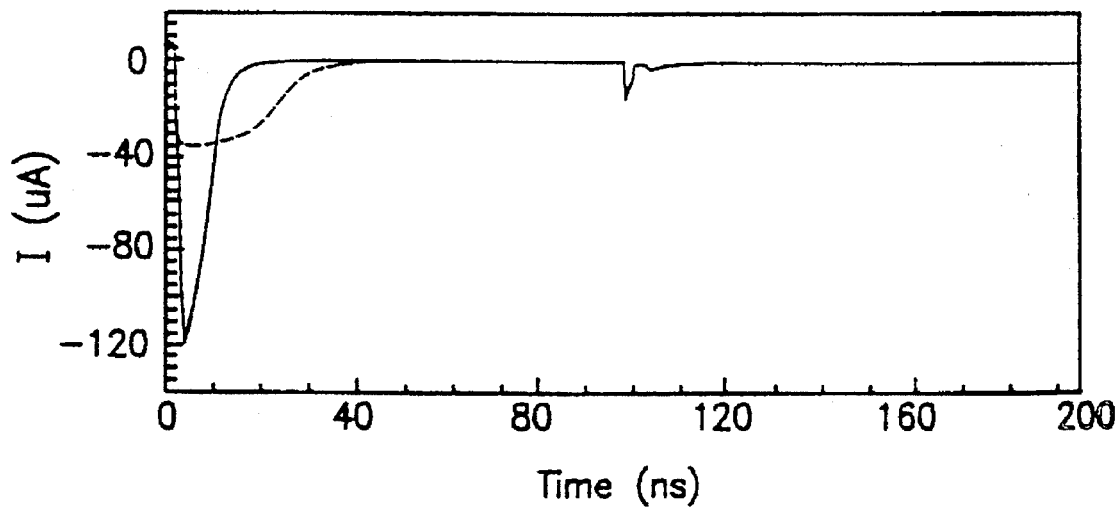

In FIGS. 6a and 6b the output rising time is 7.8 ns while the conventional one requires 19.3 ns; a large improvement of about 147%. Note that the increased area consumption for $M_{R1}$ and $C_1$ is relatively small, i.e., the capacitor $C_1$ can be formed easily above a thick oxide by double polysilicon, double metal process; $M_{R1}$ can be formed smaller than the transistors $M_1$ and $M_2$. As estimated, the increased area is merely about 6.2% larger than the conventional one.

In conclusion, with no significant increase in area, the capacitive coupling version of the dynamic threshold voltage scheme can be used in low voltage CMOS digital circuits. This CMOS inverter in accordance with the present invention demonstrates no input current in the steady-state conditions as demonstrated by two-dimensional mixed-mode circuit and device simulation.

What s claimed is:

1. A low voltage inverter, comprising:
   a CMOS inverter consisting of a PMOS transistor and an NMOS transistor; and
   a back-gate biasing circuit consisting of a capacitor and a load, wherein said capacitor is connected between an input terminal of said CMOS inverter and one of bulks of said transistors for biasing via said load.

2. The inverter as claimed in claim 1, wherein said capacitor is connected to said bulk of said PMOS transistor.

3. The inverter as claimed in claim 2, wherein said load includes a PMOS transistor having a source connected to a voltage source, a gate connected to the ground, and a drain connected to said capacitor.

4. The inverter as claimed in claim 1, wherein said capacitor is connected to said bulk of said NMOS transistor.

5. The inverter as claimed in claim 4, wherein said load includes an NMOS transistor having a source connected to the ground, a gate connected to a voltage source, and a drain connected to said capacitor.

6. A low voltage inverter, comprising:
   a CMOS inverter consisting of a PMOS transistor and an NMOS transistor; and
   a back-gate biasing circuit consisting of a first capacitor, a second capacitor, a first load and a second load; wherein said first capacitor is connected between an input terminal of said CMOS inverter and a bulk of said PMOS transistor, said second capacitor is connected between said input terminal and a bulk of said NMOS transistor, said first load biases said bulk of said PMOS transistor, and said second load biases said bulk of said NMOS transistor.

7. The inverter as claimed in claim 6, wherein said first load includes a resistor connected between a voltage source and said bulk of said PMOS transistor.

8. The inverter as claimed in claim 6, wherein said first load includes a PMOS transistor having a source connected to a voltage source, a gate connected to the ground, and a drain connected to said first capacitor.

9. The inverter as claimed in claim 6, wherein said second load includes a resistor connected between a voltage source and said bulk of said NMOS transistor.

10. The inverter as claimed in claim 6, wherein said second load includes an NMOS transistor having a source connected to the ground, a gate connected to a voltage source, and a drain connected to said second capacitor.

* * * * *